United States Patent [19]

Cuomo et al.

[11] Patent Number: 5,298,720

[45] Date of Patent: Mar. 29, 1994

[54] METHOD AND APPARATUS FOR CONTAMINATION CONTROL IN PROCESSING APPARATUS CONTAINING VOLTAGE DRIVEN ELECTRODE

[75] Inventors: Jerome J. Cuomo, Lincolndale; Michael V. Grazioso, Wappingers Falls; Charles R. Guarnieri, Somers; Kurt L. Haller, Peekskill; John E. Heidenreich, III, Yorktown Heights; Gary S. Selwyn, Hopewell Junction; Stanley J. Whitehair, Peekskill, all of N.Y.

[73] Assignee: International Business Machines Corporation, Armonk, N.Y.

[21] Appl. No.: 514,916

[22] Filed: Apr. 25, 1990

[51] Int. Cl.⁵ .............................. B23K 9/00
[52] U.S. Cl. .................. 219/121.43; 219/121.41; 219/121.52; 156/345; 315/111.21; 204/298.31
[58] Field of Search ............... 219/121.52, 121.43, 219/121.40, 121.44, 121.41; 156/345; 427/34; 204/298.35–298.38, 298.31; 315/111.21, 111.51, 111.71

[56] References Cited

U.S. PATENT DOCUMENTS

| | | |
|---|---|---|
| 4,111,783 | 9/1978 | Bindell et al. . |
| 4,316,791 | 2/1982 | Taillet ........................ 204/298 |
| 4,389,299 | 6/1983 | Adachi et al. . |
| 4,427,524 | 1/1984 | Crombeen et al. . |
| 4,461,237 | 7/1984 | Hinkel et al. . |
| 4,719,645 | 1/1988 | Yamabe et al. . |
| 4,870,653 | 9/1989 | Sher et al. . |
| 5,032,202 | 7/1991 | Tsai et al. ........................ 219/399 |

FOREIGN PATENT DOCUMENTS

| | | |
|---|---|---|
| 0198604 | 10/1986 | European Pat. Off. . |
| 0432488 | 6/1991 | European Pat. Off. . |
| 2123331 | 2/1984 | United Kingdom . |

Primary Examiner—Mark H. Paschall
Attorney, Agent, or Firm—Daniel P. Morris

[57] ABSTRACT

A process chamber having voltage driven electrodes, e.g. plasma chamber, can be made self cleaning of particle contamination by appropriate design of the workpiece or electrode surface to provide protuberances, grooves or tapers thereon which result in a predetermined pattern in the electrostatic potential within the process chamber which can trap particulate contamination in preselected regions within the plasma chamber. These particles can then be channeled out of the process chamber through a pump port.

30 Claims, 8 Drawing Sheets

METHOD AND APPARATUS FOR CONTAMINATION CONTROL IN PROCESSING APPARATUS CONTAINING VOLTAGE DRIVEN ELECTRODE

CROSS REFERENCE TO RELATED APPLICATION

Copending U.S. application Ser. No. 07/425,659 pending entitled METHODS AND APPARATUS FOR CONTAMINATION CONTROL IN PLASMA PROCESSING to R. S. Bennett et al. filed Oct. 23, 1989 discloses that contamination levels in plasma processes are reduced during plasma processing, by prevention of formation of particles, by preventing entry of particles externally introduced or by removing particles spontaneously formed from chemical and/or mechanical sources. Some techniques for prevention of formation of particles include interruption of the plasma by pulsing the source of plasma energy periodically, or application of energy to provide mechanical agitation such as mechanical shockwaves, acoustic stress, ultrasonic stress, vibrational stress, thermal stress and pressure stress. Following a period of applied stress, a tool is pumped out (if a plasma is used, the glow is first discontinued), vented, opened and flasked or particulate material is cleaned from the lower electrode and other surfaces. A burst of filtered air or nitrogen, or a vacuum cleaner is used for removal of deposition debris while the vented tool is open. Following this procedure, the tool is then used for product runs. Alternatively, improvement of semiconductor process yields can be achieved by addition of reagents to getter chemical precursors of contamination particulates and by filtration of particulates from feedgas before plasma processing. The efficiency and endpoint for the applied stress are determined, by laser light scattering, using a pulsed or continuous laser source, e.g. a HeNe laser.

FIELD OF THE INVENTION

This invention relates to apparatus and processes for reducing particulate contamination in processing using voltage driven electrodes, employing deposition etching and removal by electron cyclotron resonance, plasma, magnetron enhanced plasma, reactive ions and RF induction, most preferably, in processing of microelectronic devices using voltage driven electrodes.

BACKGROUND OF THE INVENTION

Effectiveness of plasma etching and deposition in electronic device fabrication is reduced by contamination problems. Particulate contamination is a major problem encountered during plasma processing of microelectronic materials. It is estimated that as much as 50% of current semiconductor chip yield loss may be attributed to direct or indirect effects of particulate contamination during fabrication. This fraction is expected to increase as device dimensions are reduced in future technologies. Particles that reduce process yields today range in size from the macroscopic to the submicron size.

Particulate contamination also has an extremely deleterious effect on the performance and reliability of microelectronic devices produced by plasma etching or deposition. Particulate contamination can result in device failure, poor film quality, changes in material resistivity, and impurity permeation. Further, as device dimensions are reduced, tighter control of the etching profile requires ever more stringent restrictions on the allowable particle contamination number, density and size. To meet these requirements, tightly controlled, clean rooms are required to avoid particle deposition on produce surfaces during wafer transport and handling.

Improvements in clean room technology and in the handling of in-process substrates (for semiconductor and other applications) have reduced the once appreciable introduction of particles onto substrates during non-process exposure such as wafer handling and transfer. Particulate formation during process steps, including plasma processing, may now contribute a significant fraction of total contamination exposure with corresponding yield reduction. G. S. Selwyn, R. S. Bennett and J. Singh, "In-situ Laser Diagnostic Measurements of Plasma-Generated Particulate Contamination in RF Plasmas" J. Vac. Sci. Tech. A. Vol. 7 (4), pp. 2758-2765 (Jul./Aug. 1989).

In addition, the industry trend is towards "integrated vacuum processing", or "multi-chamber processing". This means that surface contamination previously removed by wet or dry mechanical means will be more complex or impossible to remedy since it now requires removal of the substrate from the vacuum chamber. In multi-chamber tools, particulates which drop onto a wafer before, during, or at the completion or a process step may have an especially severe impact on subsequent process steps in that tool.

Recent studies in our laboratory have shown that certain etching plasmas can produce particulates which may be a significant source of product contamination and device failure. These experiments have shown that particles can be nucleated, grown and suspended in a process plasma until they are significant in size. Sizes of these particles range from the submicrons scale to hundreds of microns in diameter. In addition, when the plasma is initiated, our studies have shown that particles are transported from the wall regions of the chamber into the central plasma region. The problem is that the particles ultimately fall onto devices being fabricated in the same manufacturing environment. If particles fall before or during film deposition or pattern transfer, they can disrupt the process step. If they fall at the end of a process step, the particulates may disrupt subsequent process steps. These contaminants often produce defects which affect the device yield, performance and reliability. Similar results have been observed in deposition type plasma (PECVD Silane), see R. M. Roth, K. G. Spears, G. D. Stein and G. Wang "Spatial Dependence of Particle Light Scattering in an RF Silane Discharge" App. Phys. Lett., 46(3), 253-255 (1985)).

The effects of particulate contamination can be magnified when selective plasma etching processes are used. Certain plasma etching processes rely on a combination of feed gases and etching conditions to selectively etch material surfaces on the wafer. The chemical formation of particulates which are etching at a slow rate in these highly selective plasmas results in micromasking, or an irregular surface often referred to as "grass". This spike or hill of unreacted material will also degrade the device performance and reduce process yield.

Contrary to common belief, presence of these particulates is not always due to material flaking from chamber walls, but may also be due to gas phase processes such as homogeneous nucleation. This suggests that particle contamination problems may not be eliminated solely by rigorous attention to clean room techniques and frequent cleaning of manufacturing equipment. Instead, since the plasma itself can result in product contamination, this problem may pose a "base level" of contamination even with the higher clean room technology. It is therefore important to develop means to operate the plasma while controlling or eliminating particle formation. Further, techniques are also necessary for removing particles, once present in a process.

Laser-light scattering studies on our laboratory have indicated that the plasma composition and gas flow have a pronounced effect on the formation of particle contamination in etching plasmas. In particular, faster gas flow resulting in shorter residence time in the plasma as well as lower pressures and shorter plasma exposure, all tend to inhibit particle formation in certain plasmas. This suggests a mechanism of nucleation and growth for particle production. Feed gas chemistry also has an important effect on particle formation. Chlorine-containing plasmas are highly prone to particle formation, although non-chlorine plasmas, such as $CF_4$, can produce particles on a smaller scale. Most important, however, has been the discovery by spatially-resolved laser light scattering experiments, that particle growth occurs primarily at the sheath boundary, and may be confined to a vertical region or less than 1 mm thick.

This same region has been shown experimentally to trap plasma negative ions, resulting in high concentration of plasma negative ions in this region as explained by the reference, G. S. Selwyn, L. D. Baston and H. H. Sawin, "Detection of Cl and Chlorine-containing Negative Ions in RF Plasmas by Two-photon Laser-induced Fluorescence" Appl. Phys. Lett., 51 (12), 898-900 (1987). It has been explained theoretically by the reference: M. S. Barnes, T. J. Colter and M. E. Elta, "Large-signal Time-domain Modeling of Low-pressure FR Glow Discharges" J. Appl. Phys., 61(1), 81 (1987).

Applicant's have discovered that by modifying the surface of an electrode on which a workpiece is disposed or by modifying the surface of the workpiece particles in the plasma chamber can be channeled to predetermined locations in the plasma chamber from where they can be removed. This is achieved by a predetermined pattern of protuberances and filled or unfilled grooves in the electrode or wafer surface.

U.S. Pat. No. 4,461,237 to Hinckel et al. describes a plasma reactor for etching and depositing material at an enhanced rate on a semiconductor wafer. The effect is attributed to weakening the electric field outside the regions of the electrode opposite the wafer. The electrode opposite the wafer has holes or apertures which are filled with a dielectric such as quartz. The holes are concentric with respect to the substrates which are being etched or are angular around the electrode. The dielectric insert must be similar in shape to the substrate which is being etched. In contradistinction, the protuberances or grooves which can be filled with the dielectric according to the present invention are not required to be similar in shape with the workpiece substrate. The protuberances or grooves instead provide drainage channels in the equipotential surfaces by which contamination particles can be drained off. The protuberances or grooves of the present invention are generally at the periphery of substrate or between substrates. The Hinckel dielectric insert must be on the electrode opposite the workpiece. In contradistinction, according to the present invention, the dielectric protuberances or dielectric filled groove is generally on the same electrode as the workpiece. The field generated by the Hinckel apparatus is sufficient to intentionally alter the etch or deposition characteristics of the plasma. In contradistinction, according to the present invention, weaker fields are designed not to influence low mass electrons or ions for the purposes affecting the etch or deposition but the much weaker fields are designed to provide a directed radial gradient in the region of the sheath boundary. It is this region in which particles substantially accumulate in plasmas. This gradient affects the motion of massive particles, but has a substantially lower effect on much lighter ion and electrons.

It is an object of this invention to alter the electrostatic potential within a process chamber to selectively collect particles in predetermined regions for subsequently draining them away from the workpiece or out of the processing chamber.

It is an object of this invention to selective alter the electrostatic potential by providing grooves or protuberances or combinations thereof on the surface of the electrode holding a workpiece to be etched or upon which material is to be deposited or from which the material is to be removed or by providing protuberances or grooves on the workpiece itself.

SUMMARY OF THE INVENTION

In its broadest aspect, this invention is a deposition, or etch, or removed apparatus having a voltage driven electrode and having a means for reducing or eliminating particle contamination by channeling or deflecting particles away from predetermined surfaces to predetermined locations from which they can be removed using a passive electrostatic design.

A more particular aspect of the present invention in an apparatus and method having a processing chamber containing a voltage driven electrode and a means for providing an electrostatic potential capable of collecting and channeling to a predetermined location, particles within the processing chamber.

In a more particular aspect of an apparatus and method of the present invention the apparatus includes a means for extracting the trapped particles from the processing chamber.

These and other objects, features and advantages will become more apparent from the following detailed description and the figures appended thereto.

DETAILED DESCRIPTION OF THE PREFERRED EMBODIMENTS

Each of these processing apparati use at least one electrode in a chamber on which is disposed a workpiece. An external current or voltage source drives the electrode to a predetermined voltage (referred to herein as a voltage driven electrode) with respect to a ground which can be another electrode which can be the chamber sidewall. There can be more than one voltage driven electrode. The electrode can be driven by an A.C. or D.C. source.

For convenience the preferred embodiments will be described in terms of plasma processing, i.e., etching, deposition and ashing. However, the inventions herein are not limited to plasma processing. The invention herein generally applies to processing employing a voltage driven electrode, such as plasma processing, plasma magnetron processing, reactive ion processing, electron cyclotron resonance processing and radio frequency induction processing. Details on the construction of apparati for plasma processing, reactive ion processing, magnetron plasma processing and RF induction are described in A. R. Reinburg, "Plasma Etch Equipment and Technology" in "Plasma Etching and Induction", Eds D. M. Manos and D. L. Flamon Academic Press, Inc. (1989), in particular at pages 339-389, the teaching of which is incorporated herein by reference. Details on the construction of electron cyclotron resonance apparati are describe in W. M. Holber, "Electron Cyclotron Resonance Ion Sources" in "Handbook of Ion Beam Processing Technology, Principles, Deposition, Film Modification and Synthesis", Eds. J. J. Cuomo, S. M. Rossnagel, H. R. Kaufman, Noyes Publications, N.J. (1989). The cross referenced patent application contains additional details on process chamber design, the teaching of which is incorporated herein by reference.

As described above, it has been documented that particles generated by RF plasma processes can be a major source of contamination in semiconductor chip processing. These particles can severely reduce product yield and performance. Typically, these particles are electrostatically suspended at the plasma/sheath boundary until the plasma is turned off, at which point many of these particles fall onto the part being processed. In a plasma chamber, between the anode and cathode electrodes, at least one of which is RF biased, there is generated a plasma region which is a collection of electrons and cations. In this region there is a low electric field. Surrounding these region of low electric field is a region of high electric field which is referred to herein as the sheath region. Neutral particles on a plasma chamber pickup a negative charge from the free electrons in the system and thereby become charged particles Our research has shown that the topology of the RF electrode can result in specific particle trapping regions above the electrode. An example of these trapping regions in shown in FIG. 1 as the numbered light scattering regions. Details on the particle light scattering technique for monitoring the particles within a process chamber are described in "In-Situ Laser Diagnostic Measurements of Plasma-generated Particulate Contamination in RF Plasma" J. Vac. Sci. Tech. A. Vol. 7 (4), pp 2758-2765 (Jul./Aug. 1989) G. S. Selwyn et al. and in "Dry Processing for Submicrometer Lithography" S.P.I.E. Proceedings, Vol. 1185, 12-13, pp 86-97 (1989), G. S. Selwyn et al, the teachings of both of which are incorporated herein by reference. The cross referenced patent application contains additional details on the use of light scattering for particle detection, the teaching of which is incorporated herein by reference. The light scattering technique described in these articles uses a laser beam which is stationary with respect to the process chamber which is moved by 100 micron increments in the vertical direction to change the field of view. To obtain the photograph of FIG. 1 herein, the technique of these articles was modified to raster scan the laser beam over the interior of the process chamber. It will be apparent to those of skill in the art how to make this modification.

Figure 1:
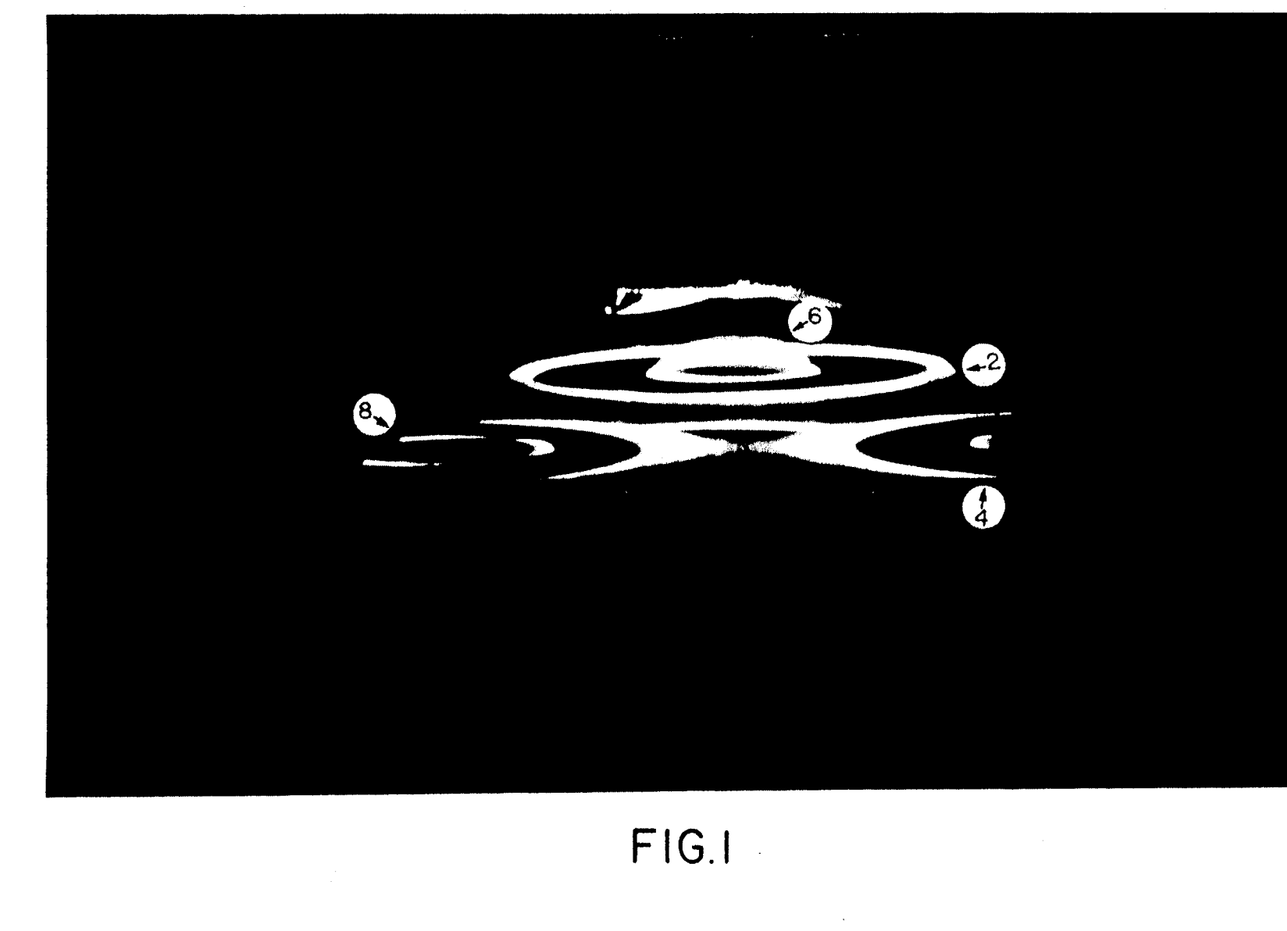
FIG. 1 is a photograph of light scattered off of particles suspended over semiconductor wafers on an electrode in a plasma chamber.

FIG. 1 is a photograph of light scattered from particles in a plasma chamber containing silicon wafers. These trapping regions include rings of particles, for example, 2 and 4 around the edges of a silicon wafer disposed on the RF electrode and domes of particles 6 and 8 that form over the center of wafers. The wafers are not visible in FIG. 1 since FIG. 1 is showing light scattered from the suspended particles. In a conventional plasma chamber when the RF fields is turned off the particles in FIG. 1 shown as rings 2 and 4 and domes 6 and 8 will fall onto the silicon wafers, thereby contributing to contamination on the surface of the wafer.

Applicants have discovered that by modifying either the surface of the electrodes upon which the silicon wafers are disposed or by modifying the surface of the workpiece, which is in this case a silicon wafer, the distribution of the rings and domes of particles can be located over those regions of the electrode on which there are no silicon wafers.

Figure 2:
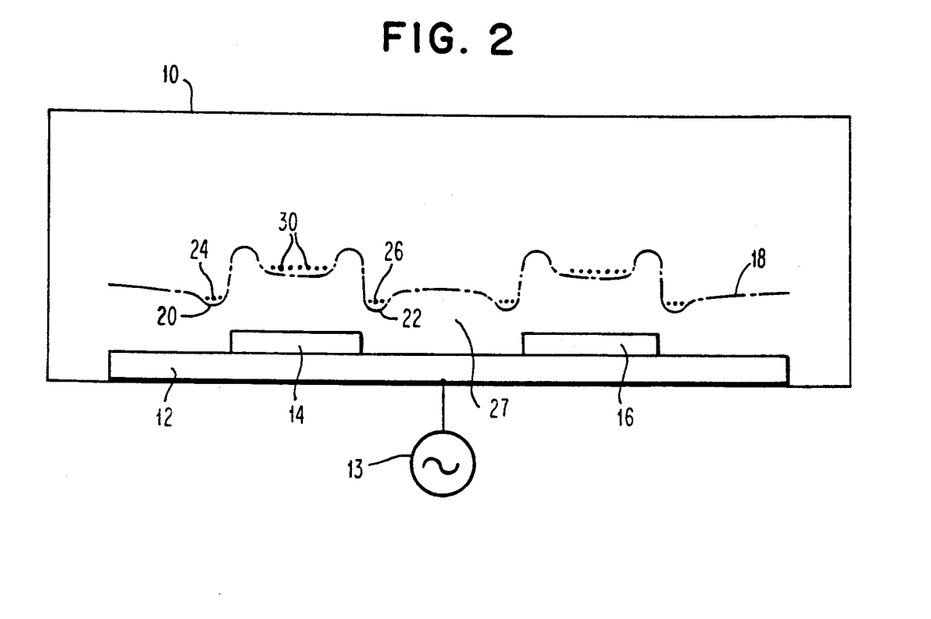
FIG. 2 is a schematic representation of the electrostatic equipotential potential to generate the particle distribution shown in FIG. 1.

FIG. 2 schematically shows a plasma chamber 10 having an electrode 12 therein. The electrode 12 is preferably driven by an RF voltage 13. The electrode 12 has thereon workpieces 14 and 16 which can be semiconductor wafers. Within the plasma chamber there is an electrostatic equipotential surface schematically shown as 18 which has relative minima 20 and 22 at the edges of wafer 14. At these relative minima 20 and 22 there are trapped particle groups 24 and 26 respectively which corresponds to the rings 2 and 4 of FIG. 1. Over the middle of wafer 14 there is a relative minima 28 in electrostatic potential 18 within which is trapped particle group 30 which corresponds to the domes 6 and 8 of FIG. 1. There are similar potential minima over wafer 16 and particle groups trapped at these minima corresponding to rings and domes. When the RF field is turned off, the electrical potential 18 vanishes and the particle groups will fall onto the wafers 14 and 16. The region 27 between wafers 14 and 16 is part of the sheath region.

Applicants have been the first to discover that the topographic features of the electrode and workpiece can result in particles being trapped in undesirable locations over a workpiece on the electrode.

Applicants have discovered how to modify the electrical potential distribution 18 so that the relative minima such as 20, 22 and 28 are not located over the workpieces 14 and 16, but located over those parts of the electrode 12 on which there are no workpieces or over the regions peripheral to that of the electrode 12. Therefore, particles produced by the process preferentially can be trapped at locations away at the parts being processed and either remove to a location from which they pose no danger of contamination to the parts being processed or removed from the chamber. This may be done by blocking movement of the particles from the tool walls into the center of the electrode, for example by creating a trappen in a region away from the workpiece, using a passive topographic design of the electrode. Such selective passive topographic designs of the electrode include, but are not limited to selective raised or recessed regions of the electrode.

Figure 3:
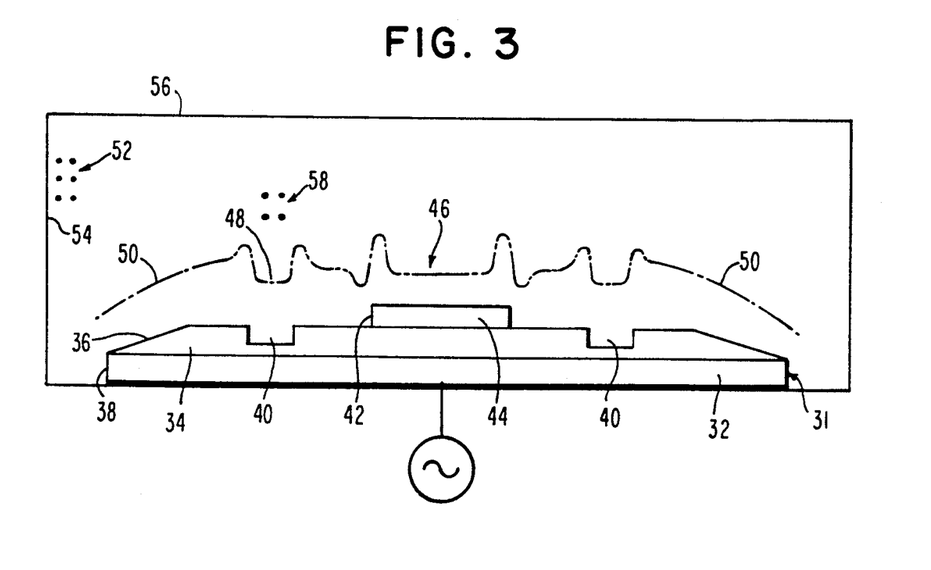
FIG. 3 is a schematic representation of an embodiment of an apparatus of the present invention wherein the electrostatic equipotential surface within the plasma chamber has a predetermined configuration provided by the structure of the electrode.

FIG. 3 schematically shows an electrode 31 which can be made from a metal base 32, for example of copper, with a dielectric layer 34, for example quartz, thereon having a tapered edge 36 in the dielectric layer 34 at the edge 38 of electrode 31 and having a groove 40 beyond the periphery 42 of workpiece 44 which is disposed on electrode 32. The equipotential of the electric field is diagrammatically shown as 46 having a minima 48 over groove 40 and a shoulder 50 over tapered edge 36. Particles 52 coming off sidewall 54 of plasma chamber 56 will be trapped in the region between sidewall 54 and the edge 38 of electrode 31 by the shoulder 50 in the equipotential surface. Particles generated in the region over the workpiece 44 will get trapped in the minima 48 shown as particle group 58. The shoulder 36 and the groove 40, although shown in a dielectric layer 34 on metal base 32 need not be within a dielectric layer. The tapered 36 and the groove 40 can be within the metal base without a dielectric layer thereover 32. Moreover, a shoulder 36 alone and a groove 40 along can be used, it is not necessary that they be used in combination. Moreover, the shoulder and groove can have any cross-sectional profile, not just triangular and rectangular as shown in FIG. 3. The cross-sectional shape will be chosen to optimize the trapping and channeling for a particular application.

Figure 4:
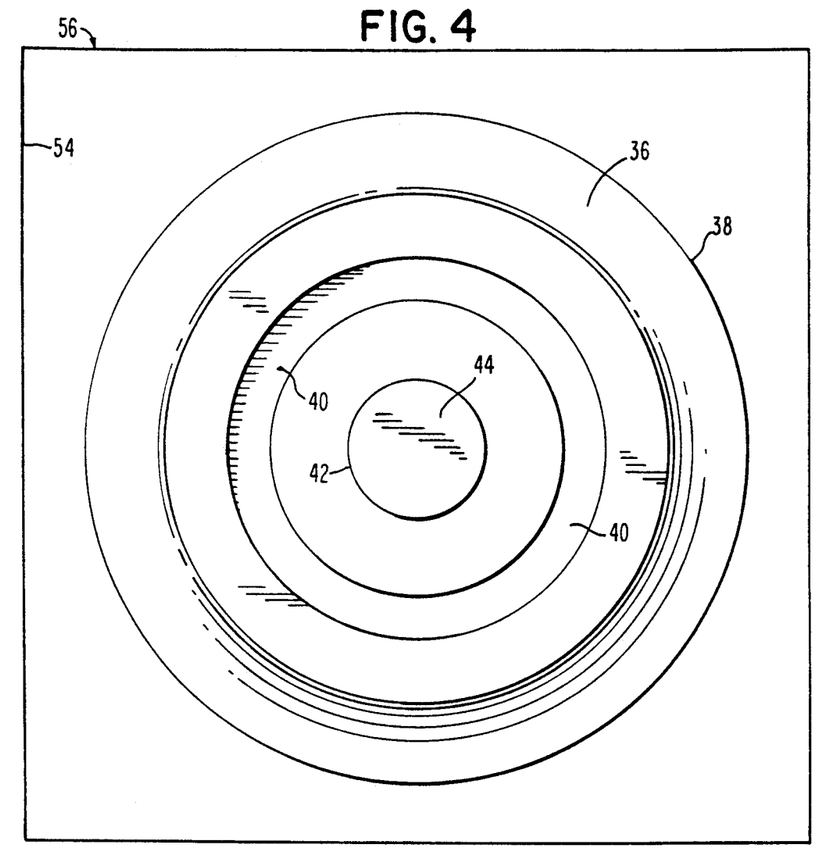
FIG. 4 is a top view of the electrode with workpiece thereon shown in FIG. 3.

FIG. 4 schematically shows a top plan view of the electrode 32 of FIG. 3 having workpiece 44 disposed thereon. Numbers common between FIG. 4 and FIG. 3 correspond to the same thing.

Figure 5:
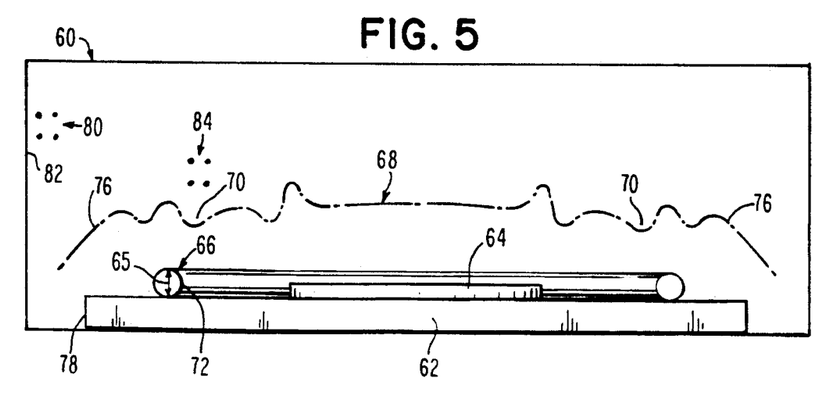
FIG. 5 is a schematic representation of another embodiment of an electrode configuration to provide a predetermined electrostatic equipotential surface to selectively collect particles in predetermined regions.

FIG. 5 schematically shows another embodiment for selectively adjusting the equipotential surface of the electromagnetic field within the plasma chamber to selectively channel particles to a predetermined location. In FIG. 5, plasma chamber 60 contains electrodes 62 which can be metal such as copper, or a metal electrode covered by a dielectric or semiconductor, e.g., silicon, surface on which is disposed workpiece 64, such as a semiconductor wafer. A ring of material 66 is disposed around the periphery of the workpiece. The ring does not have to be circular. The ring cross section is shown circular but can be any cross-sectional shape which can be chosen to optimize the channeling and trapping of particles. Ring 66 can be fabricated from any material, such as a dielectric semiconductor or a metal. A suitable dielectric is quartz and a suitable metal is copper or aluminum. The equipotential surface is represented by 68 having a minimum 70 at the inside edge 7 of ring 66 and has a shoulder 76 along the periphery 78 of electrode 62. Shoulder 76 of equipotential surface 68 traps particles 80 along the sidewall 82 of plasma chamber 60 and minima 70 of equipotential surface 68 traps particles from over the region of workpiece 64 shown as particle group 84.

Figure 6A:
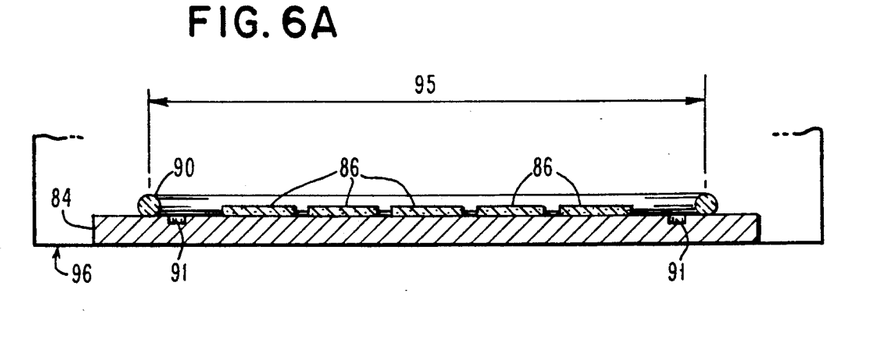
FIG. 6A is a top schematic side view of the structure of FIG. 6B.
Figure 6B:
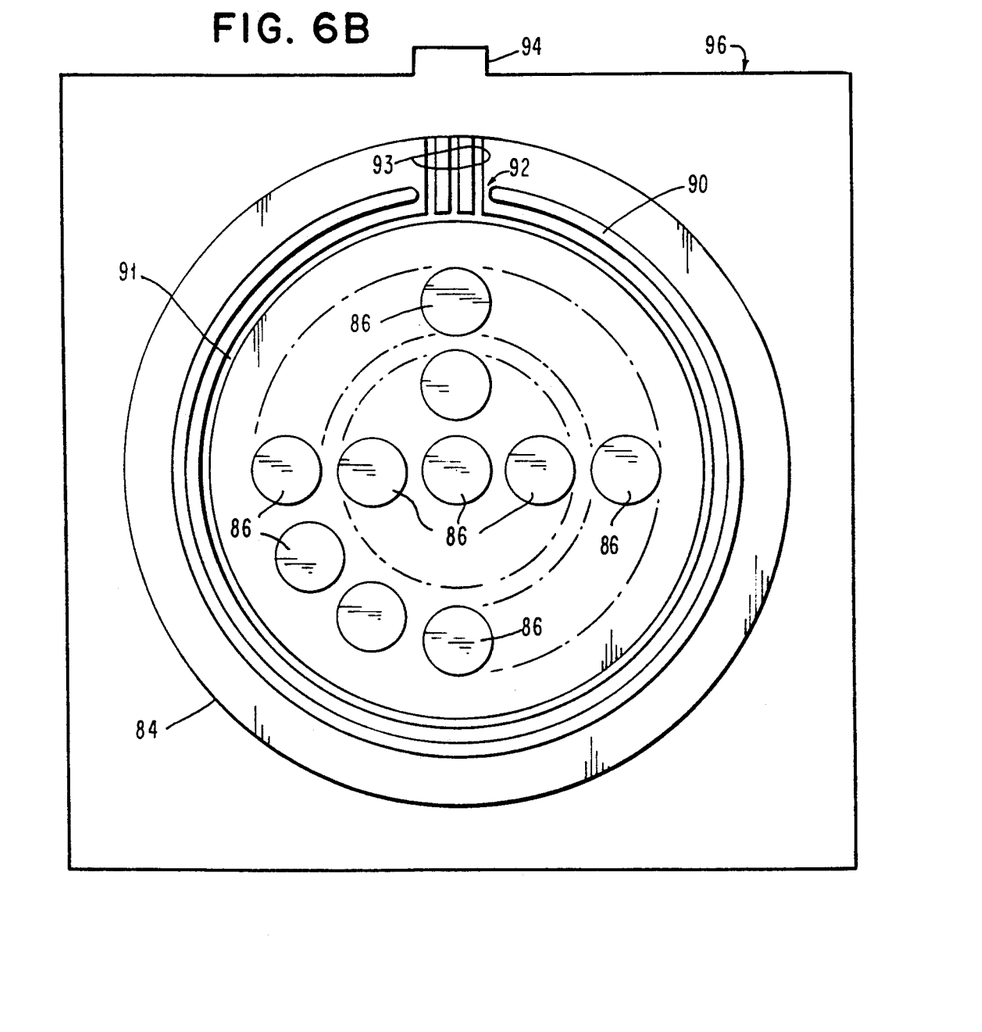
FIG. 6B is a schematic top plan view of an electrode within a process chamber having a plurality of wafers thereon.

FIG. 6A and FIG. 6B show a side and a top plan view respectively of an electrode 84 having a plurality of semiconductor wafers 86 thereon with either a ring of material 90 or a groove 91 in the surface 88 of electrode 84. The protuberance (raised region) or for groove (recessed region) 91 is shown to be circular, that is not required, it can have any other shape. There is an opening 92 in the protuberance 90. Aligned with opening 92 is a pump port 94 in plasma chamber 96. Pump ports in plasma chambers are routinely used in the art. The resultant gas flow permits contamination particles which accumulate between protuberance 90 or groove 91 and the sidewall 98 of the plasma chamber 96 to be extracted. The groove 91, at opening 92 in protuberance 90, has groove members 93 directed towards pump port 94. Pump port 94 is aligned with opening 92 in protuberance 90 and groove members 93 to permit particles which accumulate within the interior of protuberance or groove 90 to be extracted out to the pump port. This permits the particulate contamination to be extracted from the plasma chamber out through the pump port, thereby preventing these particles from being deposited onto the wafers 86 when the field is turned off. In one embodiment shown in FIG. 6A, protuberance 90 is a quartz ring having a circular cross section of diameter $\frac{1}{8}$ inches shown as 65 in FIG. 5 and a ring diameter 95 of 35 inches. The groove diameter is about 33.5 inches with a width of about 0.25 inches and a depth of about 0.08 inches. The protuberance 90 and groove surround a plurality of semiconductor wafers 86, each having a diameter of about 5 inches and a thickness of about 20 mils. The wafers were disposed on the quartz coated electrode on the interior of the ring 90 and groove 91 and the wafers were minimally spaced from the quartz ring by approximately 2 inches.

Figure 7:
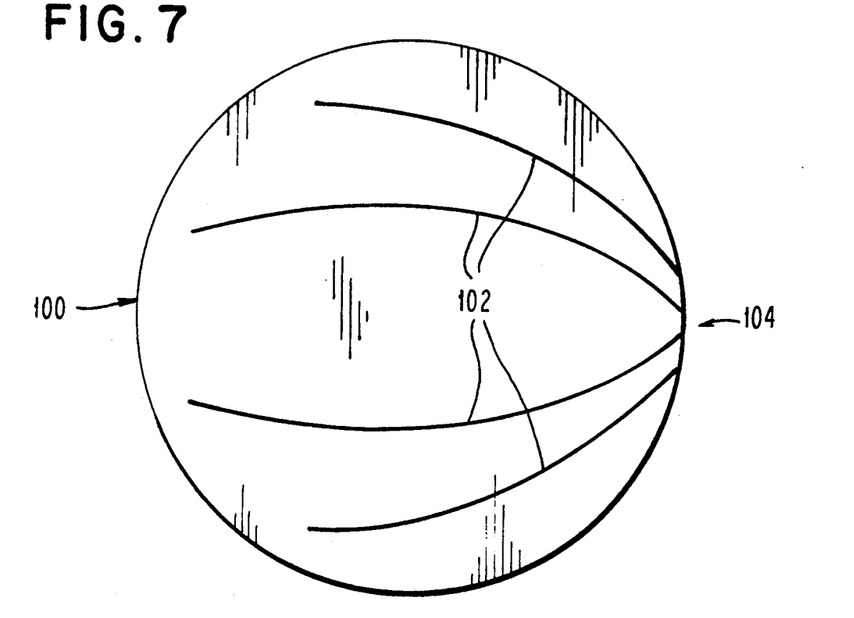
FIG. 7 is an embodiment of an electrode having a specified pattern of protuberances of grooves thereon.

FIG. 7 shows an electrode design driving a predetermined topographic pattern of protuberances or grooves 102 radiating from a region 104 of electrode 100. Using the electrode design of FIG. 7 particles can be channeled to one location 104 of the electrode which can be disposed near a pump port of a processing chamber to remove the particles.

Figure 8:
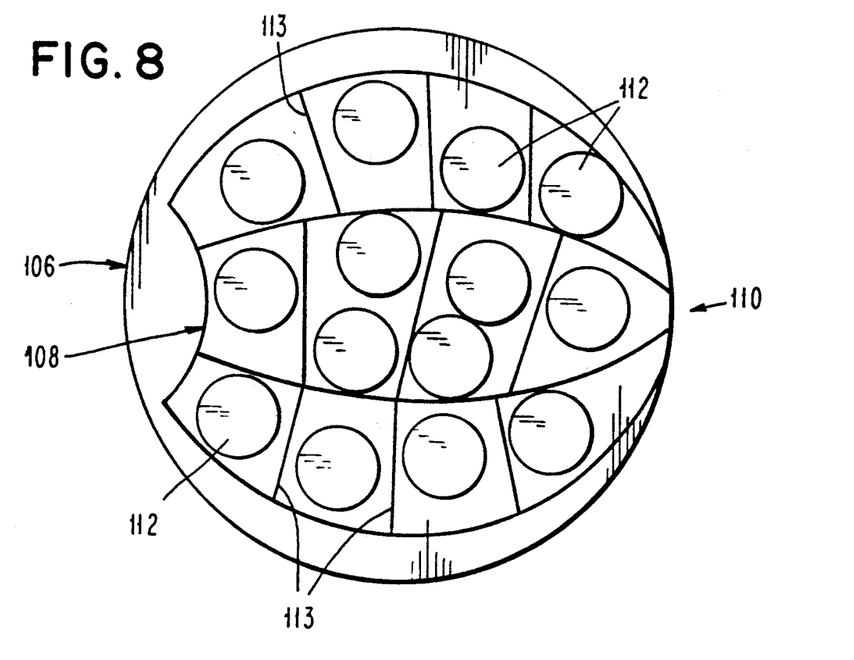
FIG. 8 is another embodiment of an electrode having a configuration of protuberances or grooves thereon.

FIG. 8 shows an electrode 106 with a plurality of workpieces 112 thereon between the workpieces there is a pattern of protuberances or grooves similar to that of FIG. 7 radiating from a central location 110 of electrode 106. A cross latch pattern 113 of protuberances or grooves interconnects the radiating topographic pattern to enhance the particle channeling properties of the topographic pattern.

Figure 9:
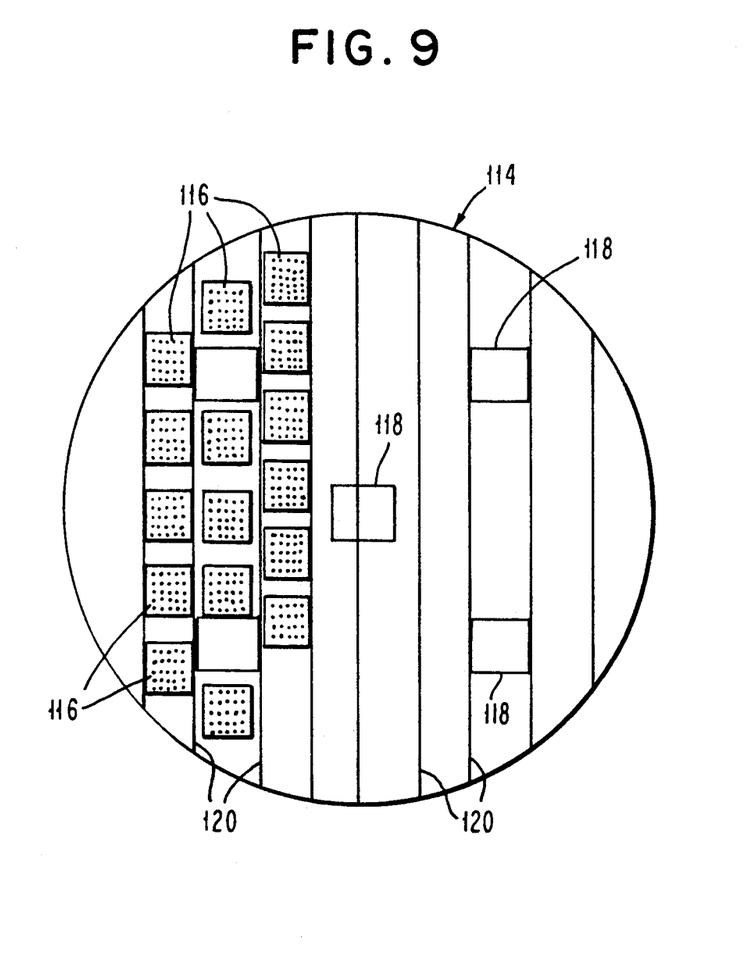
FIG. 9 is an embodiment of a plurality of grooves or protuberances on a workpiece which is placed on an electrode in a process chamber.

The protuberances or grooves are not required to be only on the electrode itself. The protuberances or grooves can be on the workpiece which is on the electrode in the process chamber. For example, FIG. 9 shows a semiconductor wafer 114 which could be placed upon an electrode in a process chamber. Semiconductor wafer 114 has a plurality of semiconductor chips 116 thereon. Typically semiconductor wafers also have a plurality of alignment locations or fiducial marks 118. Between the rows of chips there is shown a plurality of protuberances or grooves 120. These protuberances or grooves will set up an equipotential surface having channels between the chip rows permitting a pump port at one end of the plurality of rows to extract particulates from the region over the wafer.

Figure 10:
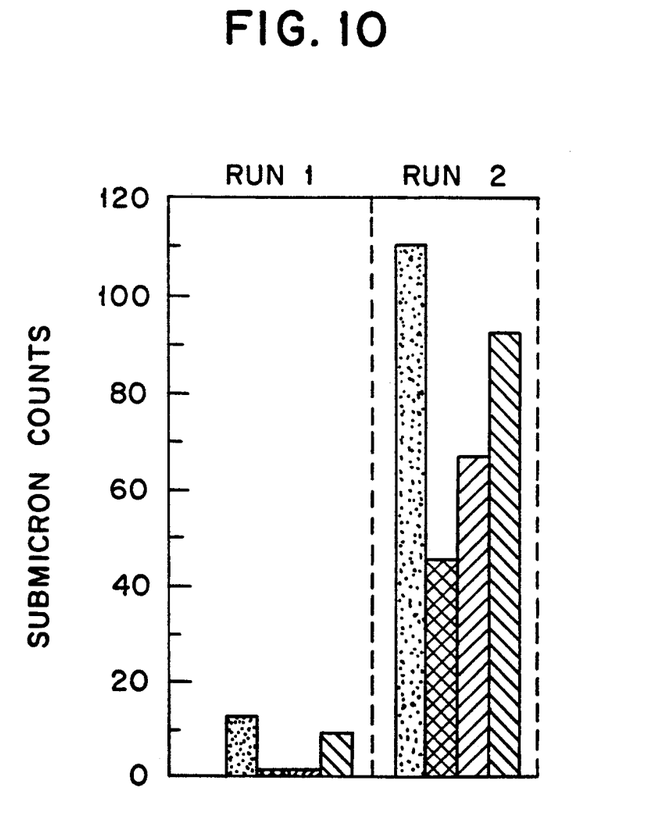
FIG. 10 shows data for the distribution of small particles deposited on semiconductor wafers after a sputtered quartz deposition process with and without the use of the present invention.
Figure 11:
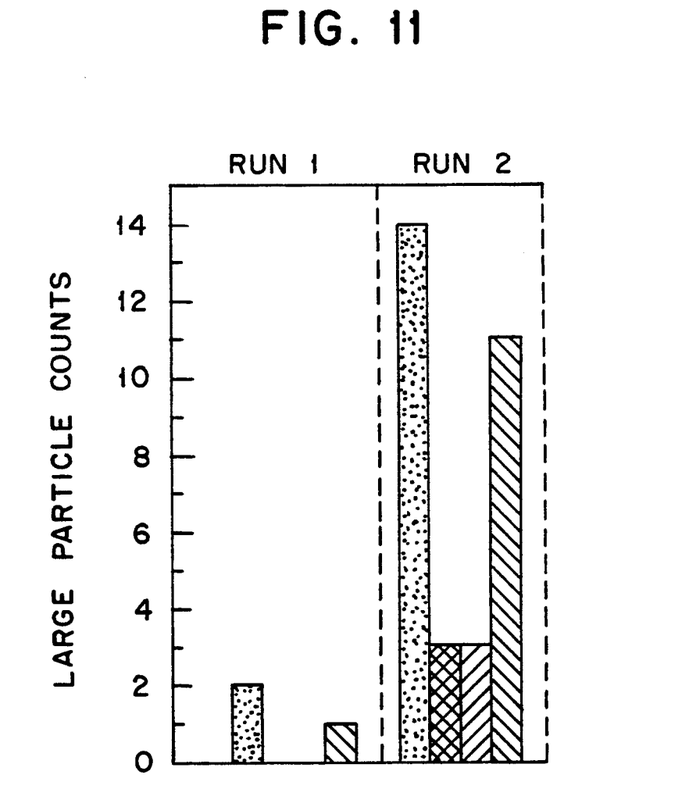
FIG. 11 is similar to FIG. 10 but is data for larger particles.

FIGS. 10 and 11 show data collected for a sputtered quartz deposition process. In this process, the primary source of particular contamination is from flaking of quartz which builds up on the tool walls. When an 8 mm thick quartz ring was placed around the electrode on which the parts are processed, as shown in FIGS. 6A and 6B, the particle counts on those parts was significantly reduced. FIGS. 9 and 10 show the measured particle counts for submicron (<2.5 microns) and large (>3 microns) particles respectively. Results are given for additional particles detected after processing for 4 wafer positions on a quartz electrode over two successive runs. Run 1 used an 8 mm cross sectional diameter quartz ring as shown in FIG. 5, run 2 was identical to run 1 but was done without the 8 mm ring. Numbers at the top of each cluster denote the sum total of all particles on the four wafers.

As an alternate design the grooves may be filled in with a material having a different dielectric constant than the remaining electrode. This may aid transport of the particles by creating a field gradient along the direction of the groove. In addition a gradual tapering of the electrode edge to promote a field gradient at the radial direction of the electrode may also be used to move the particles. In addition, a varying groove depth or protuberance height may be used to create a field gradient to move the particles. For the purpose of this application a taper in the electrode is included within the meaning of a groove.

Similar effects can be expected during plasma processing of any workpiece, such as a multi-layer ceramic substrate or magnetic disk head.

The topographic feature (protuberances, grooves, dielectric filled grooves, tapers) can be on the workpiece, the electrode the workpiece is disposed, or on an electrode on which the workpiece is not disposed. Using one or both of the techniques described herein, it is within the skill of the art to develop optimal electrode geometries for most types of processes using voltage driven electrodes.

For example, grooves or protuberances can be formed at the surface of a dielectric plate which is disposed on an electrode wherein the surface of the plate having the topographic features face the electrode. In another variation, the dielectric plate can have topographic features on both sides thereof. The plate can be a metal or semiconductor or dielectric.

In summary, the invention herein is directed to using predetermined topographic features in an electrode, a workpiece of both to remove particulate contaminants from a tool using a voltage driven electrode.

The invention herein permits semiconductor wafers to be densely packed on an electrode, in a two dimensional close packed arrangement as in a two dimensional crystal wherein there is a small spacing between wafers, e.g., 1/16" to 1.8". In this space the topographic features of the present invention can be disposed to provide electrostatic potential channels between wafers to trap and drain particles away from the wafers as taught herein. At one portion of the electrode, the channels can converge to a pump port. The electrode can have depressions within which the workpiece sits to aid in positioning.

It is understood that the above described embodiments are simply illustrative of the principles of the invention. Various other modifications and changes may be devised by those of skill in the art which will embody the principles of the invention and fall within the spirit of the scope thereof.

Having thus described the invention, we claim as new and desire to secure as letters patents is:

1. An apparatus comprising:
   a process chamber having at least one voltage driven electrode;
   means for providing an electrostatic potential capable of directing particles generated within said chamber to a means for extracting said particles from said process chamber.

2. The apparatus of claim 1, wherein said process chamber is selected from the group of a plasma chamber, a reactive ion chamber, an RF induction chamber an electron cyclotron resonance chamber and a magnetron reactor.

3. The apparatus of claim 1, wherein said apparatus contains a grounded electrode.

4. The apparatus of claim 1 wherein said means for extracting said particles is a port in said process chamber out from which said particles are drawn.

5. The apparatus of claim 1, wherein said means for providing an electrostatic potential provides an irregular electrostatic potential.

6. An apparatus comprising:
   a process chamber having a plurality of electrodes, at least one of which is a voltage driven electrode;
   means for providing an electrostatic potential capable of directing particles generated within said chamber to predetermined locations; and
   said means for providing an electrostatic potential is a predetermined topographic pattern at the surface of at least one of said plurality of electrodes.

7. The apparatus of claim 6, wherein said predetermined topographic pattern is a pattern of raised regions at said least one electrode.

8. The apparatus of claim 7, wherein raised region is a circular ring.

9. The apparatus of claim 8, wherein said ring is a dielectric material.

10. The apparatus of claim 8, wherein said ring is an electric conductor.

11. The apparatus of claim 6, wherein said means predetermined topographic pattern is a pattern of recessed regions in said at least one electrode.

12. The apparatus of claim 6, wherein said topographic pattern is a tapering in said at least one electrode.

13. The apparatus of claim 8, wherein said ring is a semiconductor.

14. The apparatus of claim 7, wherein said raised regions have varied height.

15. The apparatus of claim 11, wherein said recessed regions have varied depth.

16. An apparatus comprising:
    a process chamber having a plurality of electrodes, at least one of which is a voltage driven electrode;
    means for providing an electrostatic potential capable of directing particles generated within said chamber to predetermined locations; and
    said means for providing an electrostatic potential is a predetermined irregularity in a surface of at least one of said plurality of electrodes.

17. An apparatus comprising:

a process chamber having at least one voltage driven electrode;

means for providing an electrostatic potential capable of directing particles generated within said chamber to a means for extracting said particles from said process chamber;

said chamber contains a plurality of electrodes, there being a workpiece on at least one of said electrodes, said means for providing an electrostatic potential being a predetermined irregular surface pattern on said workpiece.

18. The apparatus of claim 17, wherein said irregular surface pattern is a plurality of recessed regions on said workpiece.

19. The apparatus of claim 17, wherein said workpiece is a semiconductor wafer.

20. The apparatus of claim 17, wherein said workpiece is a semiconductor chip packaging substrate.

21. The apparatus of claim 18, wherein said irregular surface pattern is a plurality of raised regions on said workpiece.

22. The apparatus of claim 21, wherein said raised regions have varied height.

23. The apparatus of claim 17, wherein said irregular surface pattern is a taper in said workpiece.

24. The apparatus of claim 18, wherein said recessed regions have varied depth.

25. The method of claim 23, further including extracting said particles from said predetermined locations to be exterior of said process chamber.

26. An apparatus comprising:

a process chamber having at least one voltage driven electrode;

means for providing an electrostatic potential capable of directing particles generated with said chamber to a means for extracting said particles from said process chamber;

said chamber contains a plurality of electrodes, there being a workpiece on at least one of said electrodes, said means for providing an electrostatic potential being a predetermined irregular surface pattern on at least one of said electrodes and said workpiece.

27. The apparatus of claim 26, wherein at least a part of said irregular surface pattern is filled with a material.

28. An apparatus for processing a workpiece comprising:

a process chamber having a plurality of electrodes, at least one being a voltage driven electrode;

said workpiece being disposed on one of said electrodes;

means for directing particles generated within said chamber to predetermined locations within said chamber not over said workpiece to a means for extracting said particles from said process chamber; and said means for directing said particles being a predetermined topographic pattern on least one of said electrodes in the vicinity of said workpiece.

29. A method for collecting particles in predetermined locations in a process chamber having a voltage driven electrode comprising:

providing an electrostatic potential capable of directing said particles to said predetermined locations.

30. An apparatus comprising:

a process chamber having at plurality of electric potential generating electrodes; and means for generating at least one electric potential channel capable of directing particles within said chamber to a predetermined location to a means for extracting said particles from said process chamber.

* * * * *